United States Patent
Reime

(10) Patent No.: US 7,902,841 B2
(45) Date of Patent: Mar. 8, 2011

(54) CAPACITIVE PROXIMITY SENSOR

(76) Inventor: Gerd Reime, Buehl (DE)

( * ) Notice: Subject to any disclaimer, the term of this patent is extended or adjusted under 35 U.S.C. 154(b) by 261 days.

(21) Appl. No.: 12/097,635

(22) PCT Filed: Dec. 12, 2006

(86) PCT No.: PCT/EP2006/011978
§ 371 (c)(1),
(2), (4) Date: Jun. 16, 2008

(87) PCT Pub. No.: WO2007/068457
PCT Pub. Date: Jun. 21, 2007

(65) Prior Publication Data
US 2008/0303537 A1    Dec. 11, 2008

(30) Foreign Application Priority Data

Dec. 14, 2005  (DE) .......................... 10 2005 063 023

(51) Int. Cl.
*G01R 27/26* (2006.01)
(52) U.S. Cl. ......................... 324/677; 324/658
(58) Field of Classification Search .................. 324/658, 324/677, 686
See application file for complete search history.

(56) References Cited

U.S. PATENT DOCUMENTS

| | | | |
|---|---|---|---|
| 5,770,802 A | 6/1998 | Berthold et al. | |
| 6,593,755 B1 | 7/2003 | Rosengren | |
| 2002/0070729 A1 * | 6/2002 | Muller | 324/207.26 |
| 2002/0154039 A1 | 10/2002 | Lambert et al. | |
| 2004/0189293 A1 | 9/2004 | Czipott et al. | |
| 2005/0179415 A1 | 8/2005 | Nakano et al. | |

FOREIGN PATENT DOCUMENTS

| | | |
|---|---|---|
| DE | 19701899 | 10/1997 |
| DE | 19744152 | 4/1999 |
| EP | 1106981 | 6/2001 |
| EP | 1341306 | 9/2003 |
| EP | 1583236 | 10/2005 |

* cited by examiner

*Primary Examiner* — Vincent Q Nguyen
(74) *Attorney, Agent, or Firm* — Cantor Colburn LLP

(57) ABSTRACT

Disclosed is an arrangement for monitoring changes in an object's surrounding field, including a sensor-active region(s), a measurement path(s) with a driver for applying a variable, a receiver(s) detecting a variable, a circuit connected downstream of the receiver for determining changes in a surrounding field and generating a control and/or measurement signal, a further measurement path(s) or reference section(s) with a driver to detect changes in the variable and the measurement path(s), a clock circuit switched on at time intervals of the measurement path and the reference path a regulating device for the variable(s) introduced by the drivers in response to changes in the variable in the field, with the result that at the receiver average the same amplitude of the variable passes from the drivers and the sensor-active region to the receiver from the measurement paths the sensor-active region being coupled with high resistance to the drivers.

10 Claims, 3 Drawing Sheets

CAPACITIVE PROXIMITY SENSOR

CROSS REFERENCE TO RELATED APPLICATIONS

The present application claims the priority of the German patent application 10 2005 063 023.5, filed on Dec. 14, 2005, the disclosure content of which is herewith expressly also made the subject matter of the present application.

TECHNICAL FIELD OF THE INVENTION

The invention relates to an arrangement for monitoring an object for changes in a field surrounding the object.

BRIEF DESCRIPTION OF RELATED ART

The desire exists in many areas to detect changes being produced in the surroundings of an object in order to derive therefrom, for example, control commands for opening doors or other openings. For this purpose, opto-electronically operating proximity sensors are generally used, which recognise the approach of a person to an object and derive a corresponding control command therefrom.

A device is known from US 2004/0189293 A1, on which the preamble of claim 1 is based, in which an electromagnetic field is checked for changes in the surroundings of the field. This device is used, in particular, to check people for whether they are carrying metal objects on them, such as weapons, for example. Depending on the result of the check, a passage is opened or cleared. Similar mechanisms are also shown in EP 1 583 236 A1, DE 197 01 899 A1, DE 197 44 152 A1, EP 1 341 306 A1 and EP 1 106 981 A2.

The previously known systems have in common the fact that that they do not only react to the changes to be detected in their surroundings, but are also sensitive to disturbances. Disturbances of this type may be extraneous light in the case of the opto-electronic devices and, in the inductive or capacitive solutions, the results may already be influenced by air humidity or earthing of the approaching person or the approaching object.

BRIEF SUMMARY OF THE INVENTION

Proceeding from this prior art, the invention makes an arrangement for monitoring an object more sensitive and simultaneously more insensitive to disturbance.

To detect the changes, various steps are implemented for this purpose. On the one hand, two measurement paths are balanced with one another, it being ensured by a regulating device that, at the receiver, on average the same amplitude values in total pass from the drivers of the measurement path and from the sensor-active region to the receiver from each of the measurement paths. The regulating device thus regulates the power supplied to the drivers. However, this alone is not yet sufficient to ensure the desired sensitivity even in changing surrounding conditions. This is additionally achieved in that the sensor-active region with the measurement surfaces is coupled with high resistance to the drivers in such a way that even the smallest changes in the surroundings are noticeable at the measurement surface by an amplitude and/or phase change. Simultaneously, an amplifier circuit is coupled with high resistance to the measurement surface in such a way that, as a result, the amplitude and/or phase of the measurement signal are hardly influenced or only a little.

In particular in the case of capacitive solutions, the problem namely arises that, depending on the earthing and air humidity, the charge applied by the drivers on the measurement surface either discharges too rapidly or does not discharge at all, so no reliable and unambiguous values can be determined. However, even the smallest changes at the sensor-active face are also registered at the receiver owing to the high-resistance link with simultaneously possible high amplification at the reception amplifier by means of the regulation of the charge or power introduced into the measurement paths.

The arrangement preferably works capacitively but inductive solutions can be implemented in the same manner. The high-resistance coupling is preferably also to be provided with respect to the receiver in order to thereby actually make the sensor-active region high-resistance.

If necessary, a working point may be optimised in that the impedances provided between the low-resistance and the high-resistance region are selected such that the voltage in the region of the drivers is greater than the voltage in the region of the sensor-active face, it preferably being halved in the sensor-active region compared to the voltage in the region of the drivers.

BRIEF DESCRIPTION OF THE FIGURES

The invention will be described in more detail below with the aid of the figures, in which.

DETAILED DESCRIPTION OF THE INVENTION

The invention will now be described in more detail by way of example with reference to the accompanying drawings. Nevertheless, the embodiments are only examples which are not intended to restrict the inventive concept to a specific arrangement.

Before the invention is described in detail, it is pointed out that it is not restricted to the respective components of the circuit or arrangement or of the respective method steps, as these components and methods may vary. The terms used here are merely intended to describe particular embodiments and are not used restrictively. If, in addition, the singular or indefinite article is used in the description or the claims, this also relates to the plurality of these elements as long as the overall context does not make something else clear. This also applies in the reverse direction.

In many cases it is desirable to close an access, for example by a glass door without a frame to the glass and without a cable connection to the outer frame, but which door opens automatically when approached. A sensor should not be visible in this case and a light barrier should also not be provided in front of the door. In the case of the sensor device described here, the entire door can be made into the sensor-active part as the object 10 without a cable connection to the outer frame being necessary and also without a sensor device being visible. In this case, it may also be possible to determine the direction of the approach, in order, for example, to open the door in the correct direction. The application of the arrangement is, however, not restricted to this embodiment. It can also be used in determining changes in the surroundings of other objects or else, if, in the case of a moved or moveable object, changes are produced by the movement in its surroundings or, in the case of a moved object, changes are detected, completely in general, in its surroundings.

The Figures show an arrangement for monitoring an object 10 for changes in a field surrounding the object, it being possible for the object to be any object, in the surroundings of which changes are to be detected. In the embodiment, the object 10 is, for example, a glass door, which, as the sensor-active surface 11, on its two sides, has a coating, as measurement surfaces 11a, 11b, which is intended, for example, to carry a capacitive charge. The object, in other words the door here, is therefore sensor-active as a whole or with respect to the corresponding part, wherein, in the case of the glass door, the coating is applied. This coating may also be arranged between two glass surfaces, for example. To this extent, the field surrounding the object 10 is a capacitive field in the embodiment even if the arrangement can also operate inductively in an analogous manner if the desired high-resistance coupling with the impedance Z takes place.

Figure 1:
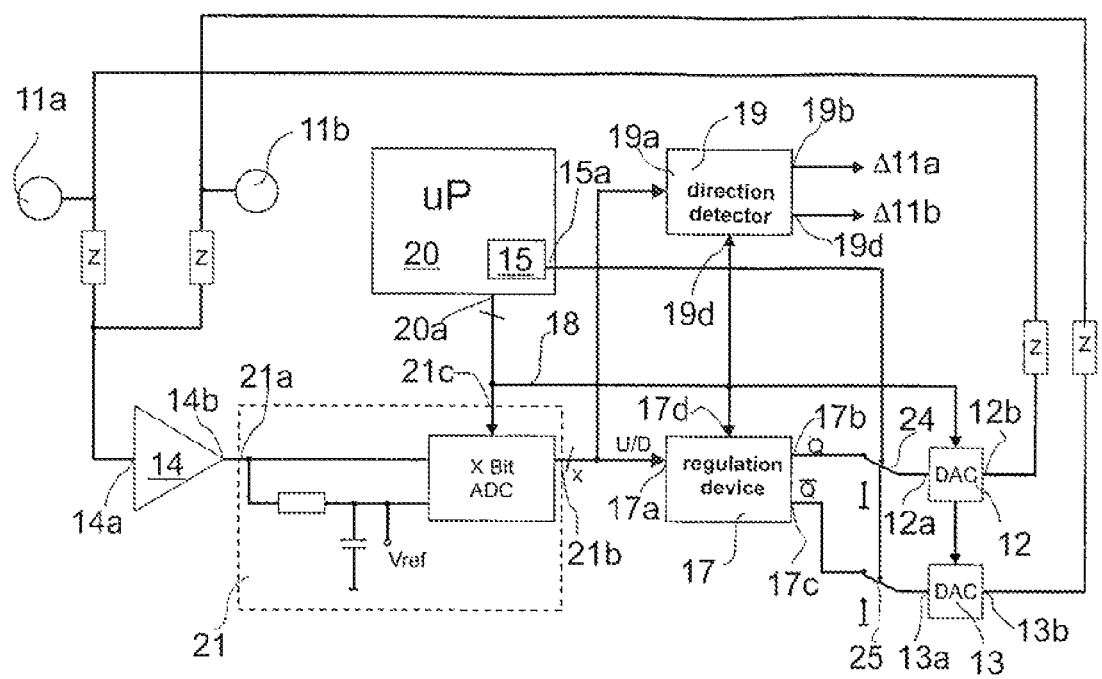
FIG. 1 shows a block diagram of the arrangement.

The arrangement has at least one sensor-active region 11 which is associated with the object 10 and formed by the two measurement surfaces 11a, 11b in FIG. 1. In principle, at least one measurement path is sufficient, within which the changes detected by the measurement surfaces 11a and/or 11b are passed on by means of the impedances Z arranged in FIG. 1 under the respective measurement surface to the input 14a of a receiver 14 which, in the embodiment of FIG. 1, is formed by a receiving amplifier. If no direction detection is desired, only one measurement surface is also sufficient. At least one driver 12, 13 is associated with each of the measurement paths to apply a determined or determinable variable in the sensor-active region. In the capacitive embodiment of FIG. 1, these drivers are digital/analogue converters (DAC) which introduce signals coming from the outputs 17b, 17c of the regulating device 17, once directly Q, and once in an inverted manner Q, into the measurement paths. The receiver 14 is used to detect the variable applied by the drivers, which may, for example, be a certain charge quantity. The receiver, however, also detects changes in the field surrounding the object 10 if, for example, a body approaches the sensor-active region 11 associated with the object 10 and thus changes the charge conditions. A synchronous demodulator circuit for determining changes at or in the field surrounding the object and to generate a control and/or measurement signal Δ11a, Δ11b is connected downstream of the receiver 14.

With correct tuning of the output power of the driver steps DAC 12, 13 in FIG. 1, the same signal is present from clock phase to clock phase at the output of the receiving amplifier. A change in the field surrounding the object 10 leads to a deviation from phase to phase. A clock synchronous output signal is thus present which is then adjusted without delay as far as possible by means of the synchronous demodulator 21, the digital regulating device 17 in the embodiment, and the drivers 12, 13 to the same values from clock phase to clock phase. For this purpose, the received signal passes from the output 14b of the amplifier 14 to the input 21a of the synchronous demodulator 21, is divided in the synchronous demodulator into its synchronous fractions and is then transmitted from the output 21b of the synchronous demodulator to the input 17a of the regulating device 17. The value for the power regulation of the drivers 12, 13 is simultaneously the measurement signal which is further evaluated. As the possible difference from clock phase to clock phase is only to be amplified on a change in the field surrounding the object, for example the approach of a person or another object, the amplifier, the receiving amplifier as the receiver 14 here, may have a very high amplification. This contributes substantially to the sensitivity of the measurement system.

For the direction-dependent detection of the changes of the field surrounding the object 10, in addition to the at least one measurement path, at least one further measurement path with an associated driver is provided. Thus, a measurement path may comprise the measurement surface 11a, while the other measurement path is associated with the measurement surface 11b. If the further measurement path is a reference path, this is not influenced by external influences, but may be provided as a reference, for example, in an enclosed housing. This would be synonymous with the glass door of FIGS. 3 to 8 only having a one-sided coating as the sensor-active region and therefore reacting uniformly to an approach from the two directions.

A clock circuit 15 is provided for the switching on at intervals of time, each of the measurement paths or the at least one measurement path and the reference path. The clock circuit 15, which emits a signal to the switches 24, 25 by way of the output 15a and alternately switches on the measurement surfaces 11a, 11b is activated by means of the controller 20 in the form of a microprocessor. It is obvious that more than two measurement surfaces may even be provided and the clock circuit then has to be correspondingly adapted. The controller 20 activates the drivers 12, 13 from the output 20a by means of the control line 18 and also, by way of the input 21c, the analog/digital converter x bit ADC in the synchronous demodulator 21. The signals being emitted from the output 12b, 13b of the drivers 12, 13 influence the predetermined or predeterminable variable, i.e. in the capacitive embodiment, the charge of the measurement surfaces 11a, 11b. Provided between the drivers and the sensor-active region 11 formed by these measurement surfaces, is a high-resistance coupling, which is shown by the impedance Z. In the embodiment, the coupling preferably takes place by means of capacitors but coils or corresponding resistors or else combinations of the aforementioned components may also be provided for this purpose. A series connection of 10 pF and 56 kΩ at a clock frequency of 100 kHz and a driver voltage of 2 volts was provided as the impedance Z in the embodiment.

The charge preferably alternating with the alternation of the clock and present at the measurement surface then passes to the receiver 14, the receiving amplifier. This forwards its received signal as an amplified output signal to the synchronous demodulator 21, in that the signals associated with the respective measurement paths and/or the reference paths are sub-divided and compared with one another in the x bit ADC to form a difference signal with the result that, at the output 21b of the synchronous demodulator 21, a signal can be emitted to the input 17a of the digital regulator (for example PI characteristic) as the regulating device 17. The signal present downstream of the synchronous demodulator 21 is, however, also simultaneously emitted to the input 19a of the direction detector 19 with signal evaluation, which from this, at the outputs 19b, 19c, emits the changes to the measurement surfaces as the control and/or measurement signal Δ11a, Δ11b. The value coming from the outputs of the regulating device 17 and present at the inputs 12a, 12b of the drivers 12, 13, for the power regulation of the drivers 12, 13 is simultaneously the measurement signal which is further evaluated. The control device 17 and direction detector 19 are if required connected to one another by means of the connections 17d, 19d and control line 30.

The regulation of the at least one variable introduced by the drivers 12, 13 into measurement paths and/or regulating paths, in other words the charge quantity in the embodiment, as a response to changes in the field surrounding the object 10 takes place in such a way that, at the receiver 14, on average the same amplitude of the predetermined or predeterminable variable, in other words, the charge in the embodiment, passes from the drivers 12, 13 and the sensor-active region 11 to the receiver 14 from each of the measurement paths. This takes place by means of a corresponding readjustment of the driver power.

According to FIG. 1, the sensor-active region 11 is preferably also coupled to the receiver 14 at high resistance and this is shown by the impedance Z. Also preferably, the high-resistance coupling, with respect to the drivers 12, 13 and the receiver 14, is preferably also approximately the same size, and this takes place in the embodiment by capacitors, resistors, coils or combinations of said components, respectively, of the same size.

Figure 2:
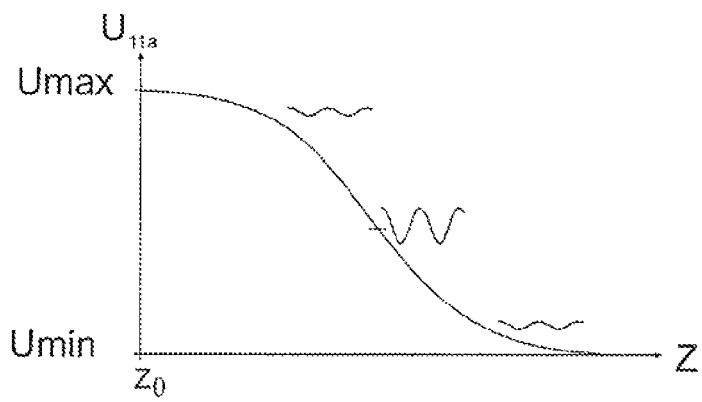
FIG. 2 shows a view relating to the optimisation of the working point.
Figure 3:
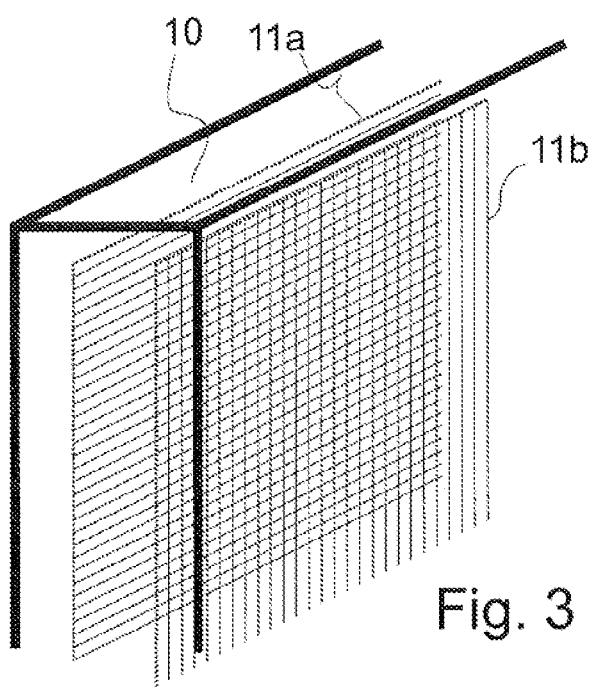
FIGS. 3, 4, 5 show the structure of an object to be monitored, such as a door with capacitive coatings in a perspective front and side view.
Figure 4:
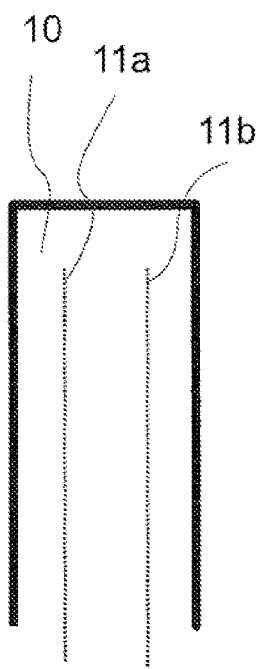
Figure 5:
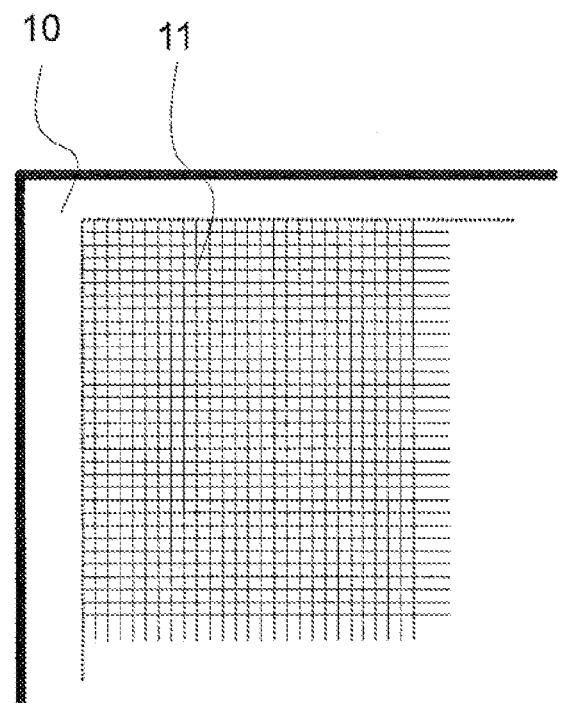
Figure 6:
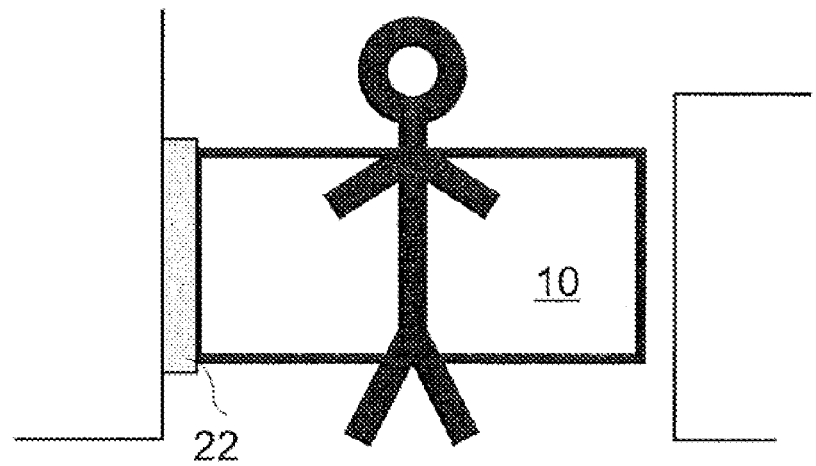
FIG. 6 shows a frontal view of an opening closed by the object.
Figure 7:
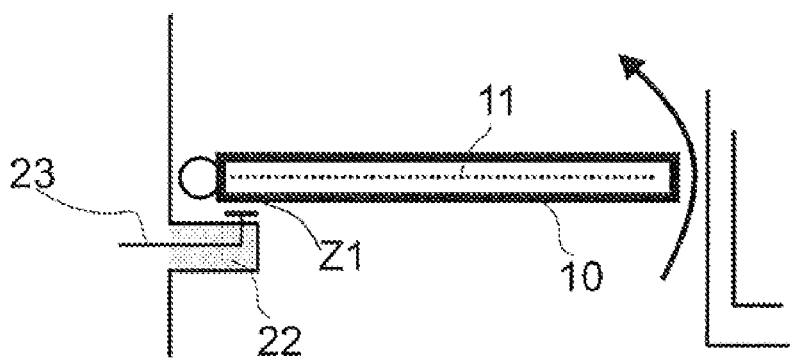
FIG. 7 shows a plan view of the opening according to FIG. 6
Figure 8:
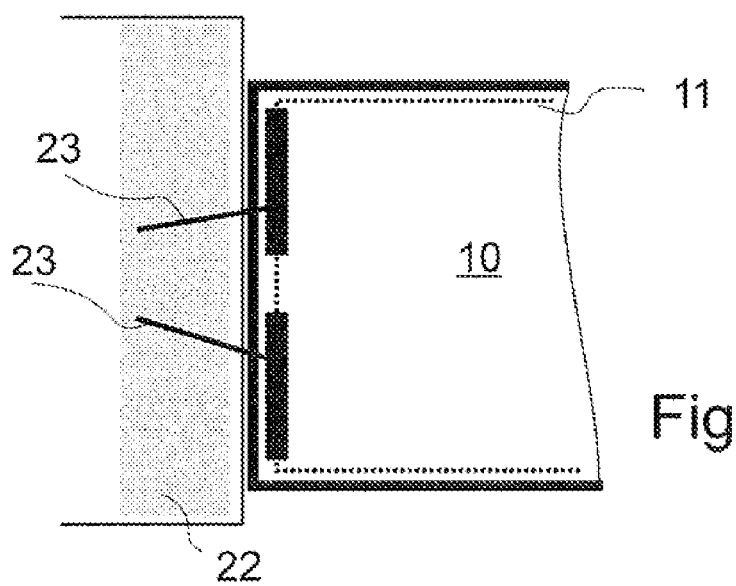
FIG. 8 shows an enlarged section from FIG. 6 in the region of the linkage of the object to the doorframe.

If the ratio of the voltage at the drivers 12, 13 to the voltage in the sensor-active region 11 is selected in such a way that this value is less than 1, the working region can be optimised according to FIG. 2. On the ordinate in FIG. 2, the voltage $U_{11a}$ at one measurement path is compared to the impedance Z. In this case it becomes clear that the rise of this curve at the maximum voltage U_max and minimum voltage U_min at the measurement surface is small, while it is greater in the central region. If values are to be derived from voltage changes, it is therefore recommended that the ratio of the voltage at the drivers 12, 13 relative to the voltage in the sensor-active region 11 should be kept between 0.1 and 0.9, preferably even approximately at 0.5. In this region, an amplitude change therefore leads to the greatest signal change.

The desired high impedance from the measurement surface 11a, 11b to the end stage and from the measurement surface to the preamplifier is produced by the small capacitance or the high resistance or the high induction—in the embodiment—of the capacitors. The smallest changes of this type also take place if the person approaching is not on an earthed base. Even a metallically conductive connection in the direct vicinity of the measurement surface does not disturb the sensitivity of the system. Because of the preamplification or the high regulation power, even the smallest changes can be detected without problem at the measurement surface.

Solutions of this type are required, in particular, if in the embodiment of FIGS. 3 to 8, the object is a door, for example a glass door, which is to open automatically as a person approaches. For this event, coatings may be arranged on the glass door, which form a capacitance as indicated by the measurement surfaces 11a, 11b in FIGS. 3 and 4. If it is desired to couple these measurement surfaces capacitively, namely according to FIGS. 7 and 8, by means of the doorframe, only small surfaces are available at the door stop in the region of the doorframe 22 so only small capacitors are suitable for this and, in particular, no cables. Although a feed line 23 at the doorframe 22 to the capacitor is possible, the surface itself is small, which, however, simultaneously allows the desired high-resistance coupling. If necessary, different regions of the door, the object 10 here, may also be coupled by means of various regions located one above the other or regions located next to one another of the doorframe. In this case, one of the capacitive couplings corresponds to the impedance Z between the drivers 12 or 13 to the measurement surface 11a, 11b, while the other capacitive coupling(s) correspond(s) to the impedance Z to the preamplifier. In the view according to FIGS. 6 to 8, only one capacitive measurement path, in other words without direction detection, is shown. If the two measurement surfaces 11a, 11b are connected by suitable measures to capacitively active surfaces at the outer edge of the pane of the glass door facing the pivot or hinge, each surface may linked to its own measurement path. This therefore allows direction-dependant detection of a person or an object approaching the door or the object 10. If, conversely, an object of this type moves, a sensor signal is also produced even when approaching a dry wooden rod, which hardly carries a charge.

The measurement surfaces 11a, 11b do not have to be configured as level faces as in FIGS. 3 to 8. Basically, the faces may adopt any desired form without the advantages of the solution according to the invention being lost. This creates a large degree of design flexibility, which is advantageous for any application purposes, in particular in proximity detection and direction detection.

Thus, a conducting wire may be arranged along a moveable rubber strip, for example, in order to implement an anti-trap protection on a moveable element, for example. This measurement arrangement may be used, for example, on a vehicle on the window, door or tailgate or on a sliding or rotating door as the described measurement arrangement virtually does not change its sensitivity even in the direct vicinity of metal frames. A person or an object in the vicinity, for example at a distance of 50 cm is recognised because of the capacitive effectiveness, while, for example, a dry wooden slat deforms the rubber strip on contact, whereupon the change in the spacing between the conducting wire and metal face makes the measurement arrangement respond. Advantageously, the electric earth of the sensor device is then connected to the electrically conductive earth of the metal frame. However, two lines may also be arranged in a flexible element, for example the rubber strip, such that they slightly change with respect to one another upon the action of an outer force. Of the two lines, one may then be the sensor-active region 11 with the measurement surface and the other may be the electric earth of the sensor. However, a direction-dependent detection is also possible here if the two lines are operated as measurement surfaces 11a, 11b.

In addition, it is obvious that the digital solution shown in FIG. 1 can also be constructed in an analogue manner.

The signals of the clock circuit 15 may have any desired pulse form. This form is not restricted here to a rectangular signal, in this case, but the clock signal may also be sinusoidal if this is advantageous for certain purposes of use. The drivers may also be operated by means of a split band spectrum to thus as far as possible avoid resonance with frequencies present in the surroundings. The methods to be applied here such as, for example, TDMA, CDMA, FDMA etc. are known to the person skilled in the art.

It is obvious that this description may be subject to various modifications, changes and adaptations which are within the range of equivalents to the attached claims.

The invention claimed is:

1. Arrangement for monitoring an object for changes in a field surrounding the object, comprising;
    at least one sensor-active region associated with the object,
    at least one measurement path with an associated driver for applying a determined or determinable variable in the sensor-active region,
    at least one receiver for detecting a variable applied by the drivers and changes in the variable in the field surrounding the object in the sensor-active region,
    a circuit connected downstream of the receiver for determining changes in a field surrounding the object and for generating at least one of a control and measurement signal using the changes detected, wherein to detect changes in the variable in the field surrounding the object, in addition to the at least one measurement path, there is provided at least one further measurement path or a reference section with an associated driver, wherein there is provided a clock circuit for switching on at intervals of time each of the measurement paths or the measurement path and the reference path, wherein there is provided a regulating device for regulating the at least one variable introduced by the drivers into at least one of the measurement paths and the reference path in response to changes in the variable in the field, with the result that at the receiver average the same amplitude of the variable passes from the drivers and the sensor-active region to the receiver from each of the measurement paths, and wherein the sensor-active region is coupled with high resistance at least to the drivers.

2. Arrangement according to claim 1, in wherein the field surrounding the object is a capacitive field and in wherein the variable is a capacitive charge.

3. Arrangement according to claim 1, wherein the sensor-active region is also coupled with high resistance to the receiver.

4. Arrangement according to claim 1, wherein the sensor-active region is formed by at least one measurement surface.

5. Arrangement according to claim 1, wherein capacitors, resistors, coils or combinations of said components are used for high-resistance coupling.

6. Arrangement according to claim 5, wherein the high-resistance coupling with respect to the drivers and the receiver takes place by means of capacitors of substantially equal size.

7. Arrangement according to claim 1, wherein a ratio of a voltage in the sensor-active region to a voltage of the drivers is less than 1.

8. Arrangement according to claim 7, wherein the ratio is between 0.1 and 0.9.

9. Arrangement according to claim 8, wherein the ratio is approximately 0.5.

10. Arrangement according to claim 1, wherein the object is a door or an opening.

* * * * *